United States Patent

Bae

[11] Patent Number: 5,776,640
[45] Date of Patent: Jul. 7, 1998

[54] PHOTO MASK FOR A PROCESS MARGIN TEST AND A METHOD FOR PERFORMING A PROCESS MARGIN TEST USING THE SAME

[75] Inventor: Sang Man Bae, Kyoungki-do, Rep. of Korea

[73] Assignee: Hyundai Electronics Industries Co., Ltd., Kyoungki-do, Rep. of Korea

[21] Appl. No.: 867,457

[22] Filed: Jun. 2, 1997

[30] Foreign Application Priority Data

Jun. 24, 1996 [KR] Rep. of Korea ............ 96-23264

[51] Int. Cl.⁶ .................................................. G03F 9/00
[52] U.S. Cl. ........................................... 430/5; 430/22
[58] Field of Search ..................... 430/5, 22; 355/53, 355/76

[56] References Cited

U.S. PATENT DOCUMENTS

| | | | |
|---|---|---|---|
| 4,530,891 | 7/1985 | Nagarekawa et al. | 430/5 |
| 4,657,648 | 4/1987 | Nagarekawa et al. | 204/192.26 |
| 4,696,877 | 9/1987 | Matsui et al. | 430/5 |
| 5,468,580 | 11/1995 | Tanaka | 430/5 |
| 5,498,500 | 3/1996 | Bae | 430/22 |

Primary Examiner—S. Rosasco
Attorney, Agent, or Firm—Gary M. Nath; Nath & Associates

[57] ABSTRACT

A photo mask capable of reducing the time taken to carry out a process margin test and a method for performing a process margin test using the photo mask. The method includes the steps of preparing a wafer, coating a photoresist film over the wafer, performing a light exposure and development process for the photoresist film using a photo mask over which a plurality of unit patterns each consisting of three different process margin patterns are arranged, thereby forming a photoresist film pattern, and comparing an image of the photoresist film pattern with data about the process margin patterns of the photo mask stored in a CAD, thereby performing a process margin test.

13 Claims, 4 Drawing Sheets

PHOTO MASK FOR A PROCESS MARGIN TEST AND A METHOD FOR PERFORMING A PROCESS MARGIN TEST USING THE SAME

BACKGROUND OF THE INVENTION

1. Field of the Invention

The present invention relates to a photo mask used for a lithography process involved in the fabrication of semiconductor devices, and more particularly to a photo mask provided with a process margin test pattern adapted to rapidly and easily measure a process margin in a lithography process. The present invention also relates to a method for testing a process margin in a lithography process using the photo mask.

2. Description of the Prior Art

In the fabrication of semiconductor devices, a variety of processes are carried out using a variety of equipment and devices. However each process has a certain limitation. Based on such a limitation, a process margin is set. Under this condition, the fabrication of semiconductor devices is carried out. For example, the process margin includes a margin for the depth of focus and a light exposure margin. In addition, a biasing margin is given for an etch process involved in the fabrication of semiconductor devices. The biasing margin is associated with a difference between the pattern size obtained after the development and the pattern size obtained after the etching. Thus, the fabrication of semiconductor devices is carried out within a variety of given process margins.

Meanwhile, in order to measure such process margins, a process margin test has been conventionally conducted using a CD-SEM utilizing E-beams or an optical microscope utilizing white beams. However, such conventional methods are problematic in that they require a lengthened test time. Furthermore, an additional device is also required to test errors, such as a butting error, misplacement and scan tolerance, generated due to the use of an E-beam or optical laser recording device in the fabrication of a photo mask.

SUMMARY OF THE INVENTION

An objective of the invention is to solve the above-mentioned problems involved in the prior art and to provide a photo mask capable of reducing the time taken to carry out a process margin test and a method for performing a process margin test using the photo mask.

Another objective of the invention is to provide a photo mask capable an improving productivity by applying data about process margins to patterning processes, respectively, and a method for performing a process margin test using the photo mask.

In accordance with one aspect of the present invention, provides a photo mask is provided and comprises: a first process margin test pattern including a plurality of line/space patterns consisting of a first pair of line/space patterns having different lengths and a second pair of line/space patterns having different lengths while having a linewidth different from that of the first line/space pattern pair, the first and second line/space patterns being laterally arranged in a repeated manner, and a plurality of contact holes consisting of a first pair of contact holes and a second pair of contact holes, the first and second contact hole pairs being laterally and longitudinally arranged in a repeated manner while being longitudinally spaced from the line/space patterns by a desired distance; a second process margin test pattern including two sets of line/space patterns formed in a symmetrical manner on upper and lower portions of the second process margin test pattern, respectively, each of the line/space pattern sets including a plurality of line/space patterns consisting of a first pair of line/space patterns having different lengths and a second pair of line/space patterns having different lengths while having a linewidth different from that of the first line/space pattern pair, the first and second line/space patterns being laterally arranged in a repeated manner, the longer ones of the first and second line patterns in the upper line/space pattern set being in contact with the corresponding longer ones in the lower line/space pattern set at their facing ends, respectively, whereby the second process margin test pattern has a symmetrical pattern structure; and a third process margin test pattern including two sets of line/space patterns formed in a symmetrical manner on upper and lower portions of the second process margin test pattern, respectively, each of the line/space pattern sets including a plurality of line/space patterns consisting of a first pair of line/space patterns having different lengths and a second pair of line/space patterns having different lengths while having a linewidth different from that of the first line/space pattern pair, the first and second line/space patterns being laterally arranged in a repeated manner, the longer ones of the first and second line patterns in the upper line/space pattern set being spaced from the corresponding longer ones in the lower line/space pattern set by a desired distance at their facing ends, respectively, whereby the second process margin test pattern has a symmetrical pattern structure.

In accordance with another aspect of the present invention, a method for performing a process margin test is provided and comprises the steps of: preparing a wafer; coating a photoresist film over the wafer; performing a light exposure and development process for the photoresist film using a photo mask over which a plurality of unit patterns each consisting of three different process margin patterns are arranged, thereby forming a photoresist film pattern; and comparing an image of the photoresist film pattern with data about the process margin patterns of the photo mask stored in a CAD, thereby performing a process margin test.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
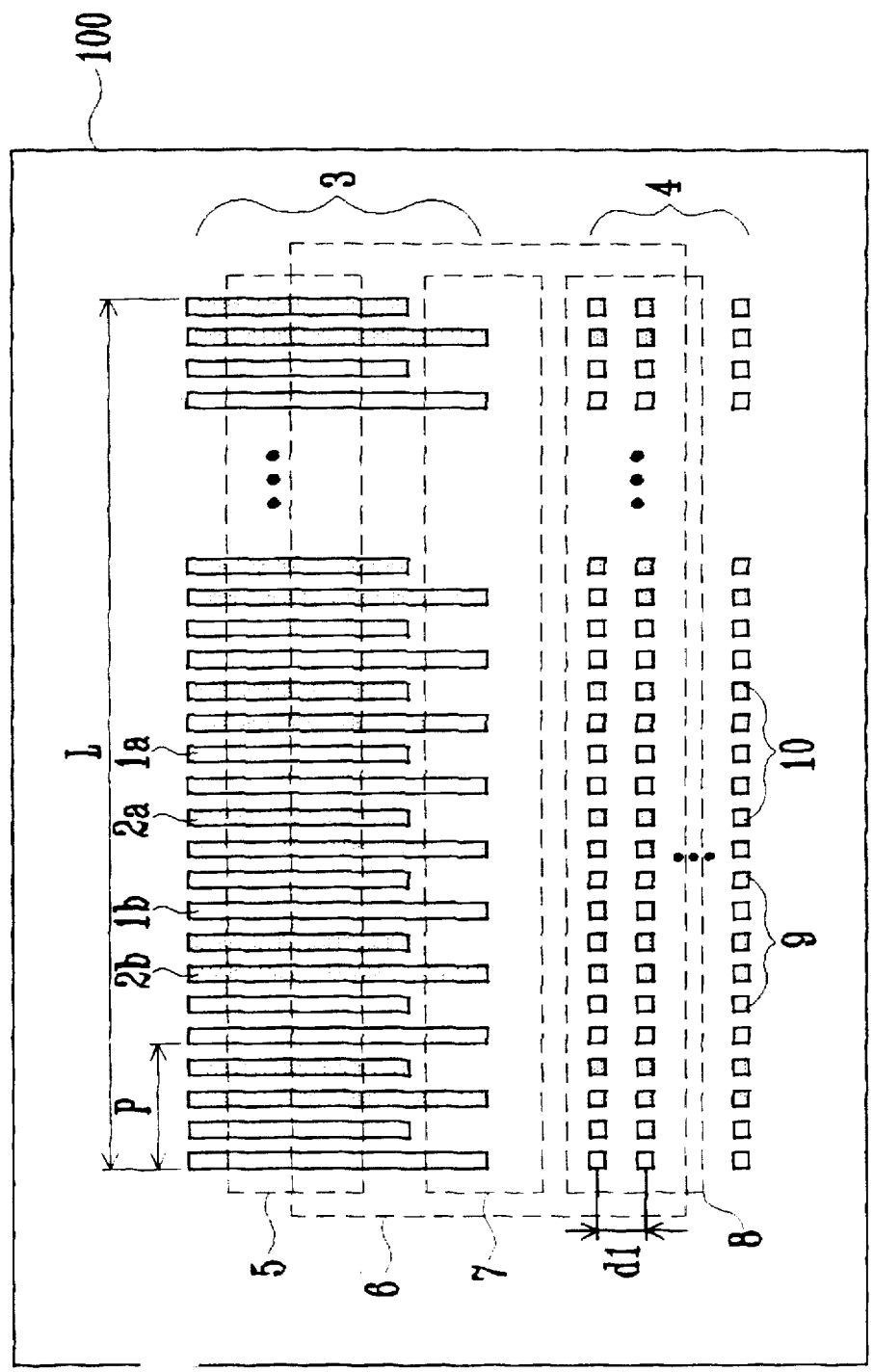
FIG. 1 is a plan view illustrating a first process margin test pattern having line/space patterns and contact holes in accordance with the present invention.

FIG. 1 illustrates a first process margin test pattern according to the present invention.

As shown in FIG. 1, the first process margin test pattern, which is denoted by the reference numeral 100, is provided with lines/spaces and contact holes. The first process margin test pattern is adapted to compare a line/space pattern with a contact hole forming process margin.

As shown in FIG. 1, the first process margin test pattern 100 includes a line/space pattern portion 3 having a plurality of spaced lines and a contact hole portion 4 having contact holes. The lines and contact holes are repeatedly arranged laterally on the first process margin test pattern 100 in such a manner that the pattern 100 has four lines and eight contact holes in every pitch.

In every pitch, the first process margin test pattern 100 has a pair of first line patterns 1a and 1b and a pair of second line patterns 2a and 2b. For a light exposure process, the first and second line patterns have linewidths of about 0.4 μm and about 0.45 μm, respectively, where i-line ($\lambda$=365 nm) is used as a light source. Of course, the linewidths of the line patterns may be selected from a range of about 0.3 to 1 μm even when i-line ($\lambda$=365 nm) is used as a light source.

Where the light source used is KrF ($\lambda$=248 nm), the linewidths of the line patterns are preferred to be about 0.3 μm and about 0.35 μm, respectively. Of course, the linewidths of the line patterns may be selected from a range of about 0.2 to 0.7 μm even when KrF ($\lambda$=248 nm) is used as a light source.

Where the light source used is ArF ($\lambda$=193 nm), the linewidths of the line patterns may be selected from a range of about 0.15 to 0.5 μm.

In every pitch, the first process margin test pattern 100 also has a pair of first contact holes 9 and a pair of second contact holes 10. The first and second contact holes 9 and 10 have sizes identical to the linewidths of the first and second line patterns or larger than the linewidths of the first and second line patterns by 0.05 to 0.1 μm, respectively.

Preferably, the first process margin test pattern 100 has a lateral length L ranging from about 2,000 μm to 4,000 μm.

The longer of the first and second lines in every pitch, namely, the lines 1b and 2b, have a length of about 100 to 1,000 μm whereas the shorter of the first and second lines, namely, the lines 1a and 2a, have a length corresponding to half the length of the longer lines 1b and 2b.

The contact hole portion 4 of the first process margin test pattern 100 has a width of about 100 μm.

The reason why the line/space patterns have different lengths is to measure a proximity effect associated with the uniformity of critical dimensions in a lithography process.

That is, where a light exposure process is carried out using the first process margin test pattern 100, a difference in the diffraction phenomenon is exhibited between different portions of the first process margin test pattern 100, namely, a higher pattern density portion 5 and a lower pattern density portion 7, while light passes between adjacent lines. Due to such different diffraction phenomenons, the portions 5 and 7 of the first process margin test pattern 100 have different CD's.

Thus, where the first process margin test pattern 100 is subjected to a light exposure process using a stepper, a severe difference in CD occurs in accordance with a variation in the depth of focus in the stepper.

Accordingly, it is possible to determine an allowable process margin using a defect measuring device which is adapted to compare the size of each image pattern formed on a wafer with the corresponding CAD data, thereby checking the generation of defects.

In this case, the pattern portions of the process margin test pattern are sequentially checked in the order of portions 5, 6, 7 and 8 while being compared with corresponding CAD data. Based on the result of the checking, it is possible to measure the number of detected defects and the difference in density.

It is also possible to determine the difference in margin between lines/spaces or contact holes having the same pattern size and the difference in CD between the line/space pattern checking portions 5 and 7 having the same line/space pattern size.

Where the checking portion 6 is selected for the process margin test, it is possible to simultaneously compare three pattern portions, for example, a high density line/space pattern area, a low density line/space pattern area and a contact hole area.

Figure 2:
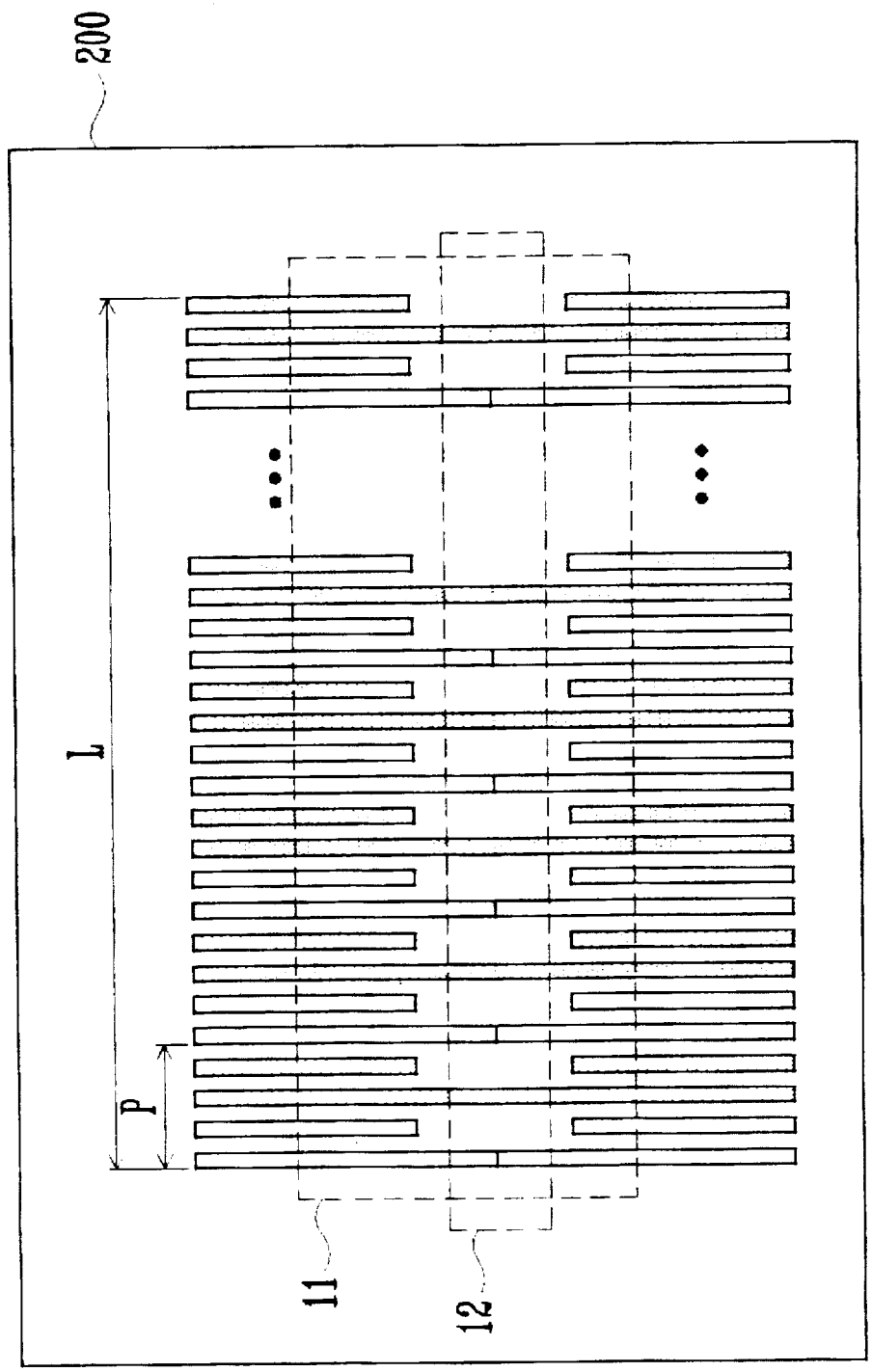
FIG. 2 is a plan view illustrating a second process margin test pattern having line/space patterns in accordance with the present invention.

FIG. 2 illustrates a second process margin test pattern according to the present invention.

As shown in FIG. 2, the second process margin test pattern, which is denoted by the reference numeral 200, is provided with line/space patterns in a symmetrical manner. That is, two sets of line/space patterns shown in FIG. 1 are formed on the upper and lower portions of the second process margin test pattern 200, respectively. In this pattern 200, there is no gap between the line/space pattern sets. This second process margin test pattern 200 is adapted to check a difference in CD for a pattern structure having vertical symmetry in terms of pattern density.

The second process margin test pattern 200 includes, as defect checking areas, a portion 11 having a region, where lines and spaces are densely formed, and a region, where lines and spaces are sparsely formed, and a portion 12 having only the sparse line/space region. The defect checking may be carried out for a one of the portions 11 and 12.

Figure 3:
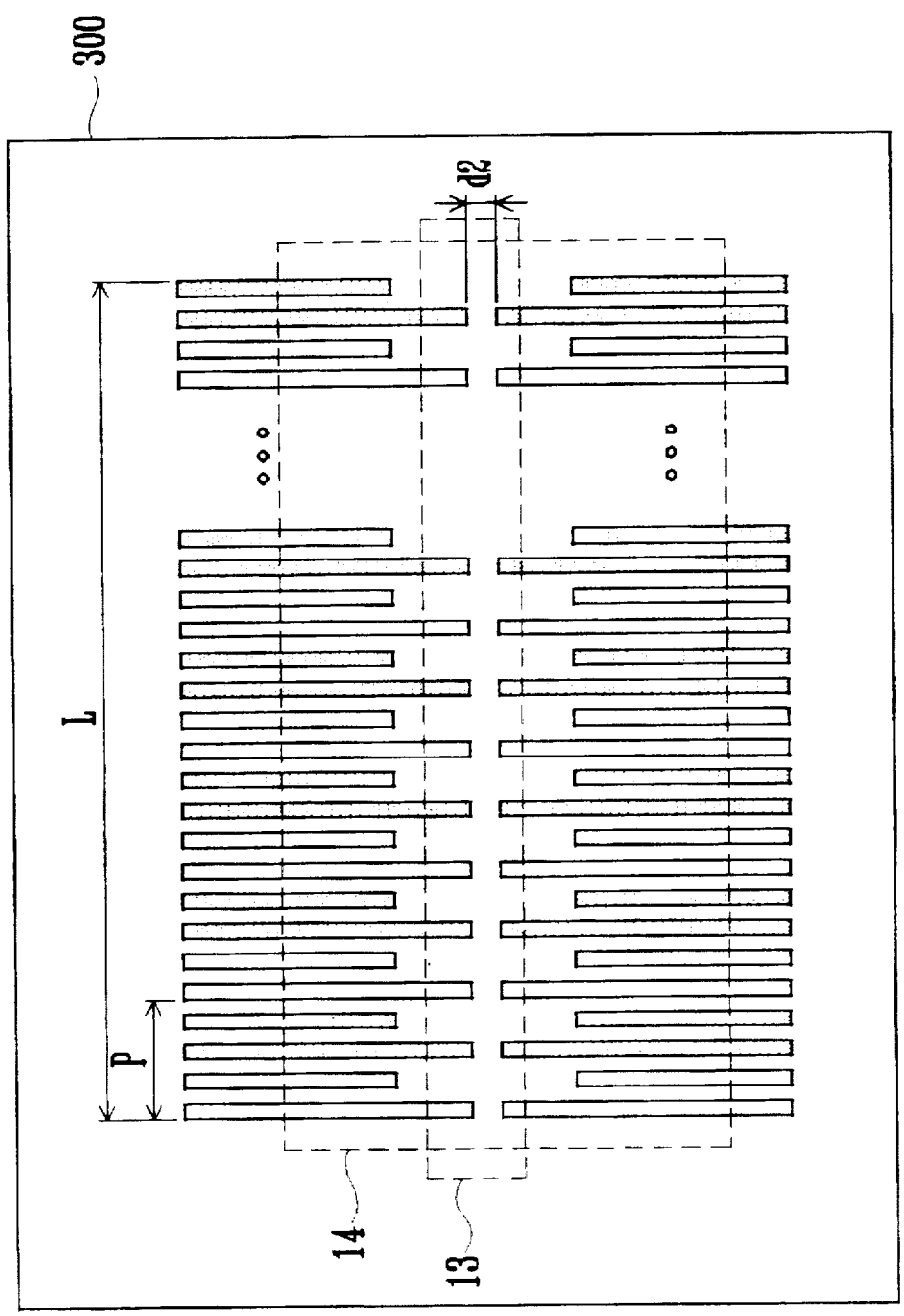
FIG. 3 is a plan view illustrating a third process margin test pattern having line/space patterns in accordance with the present invention.

FIG. 3 illustrates a third process margin test pattern according to the present invention.

As shown in FIG. 3, the third process margin test pattern, which is denoted by the reference numeral 300, is provided with line/space patterns in a symmetrical manner. That is, two sets of line/space patterns shown in FIG. 1 are formed on the upper and lower portions of the second process margin test pattern 200, respectively. In this pattern 300, there is a gap d2 between the line/space pattern sets. This second process margin test pattern 300 is adapted to measure a booting error in the fabrication of a process margin test pattern using E-beams and to check an edge effect of a line/space pattern arranged along a longer axis on a wafer. That is, the pattern 300 is used to test a short circuit occurring at the wafer in accordance with the gap d2 between the upper and lower pattern sets and to evaluate the lens characteristic of a stepper used.

The second process margin test pattern 200 includes, as defect checking areas, a portion 14 having a region, where lines and spaces are densely formed, and a region, where lines and spaces are sparsely formed, and a portion 13 having only the sparse line/space region. The defect checking may be carried out for one of the portions 13 and 14.

The result of the defect checking includes a difference in the rate of detected defects between the upper and lower patterns and a difference in the defect distribution between those patterns. Based on such a result, it is possible to evaluate characteristics of the optical exposure device as used, a light exposure phenomenon, and a process margin such as resist bake.

Figure 4:
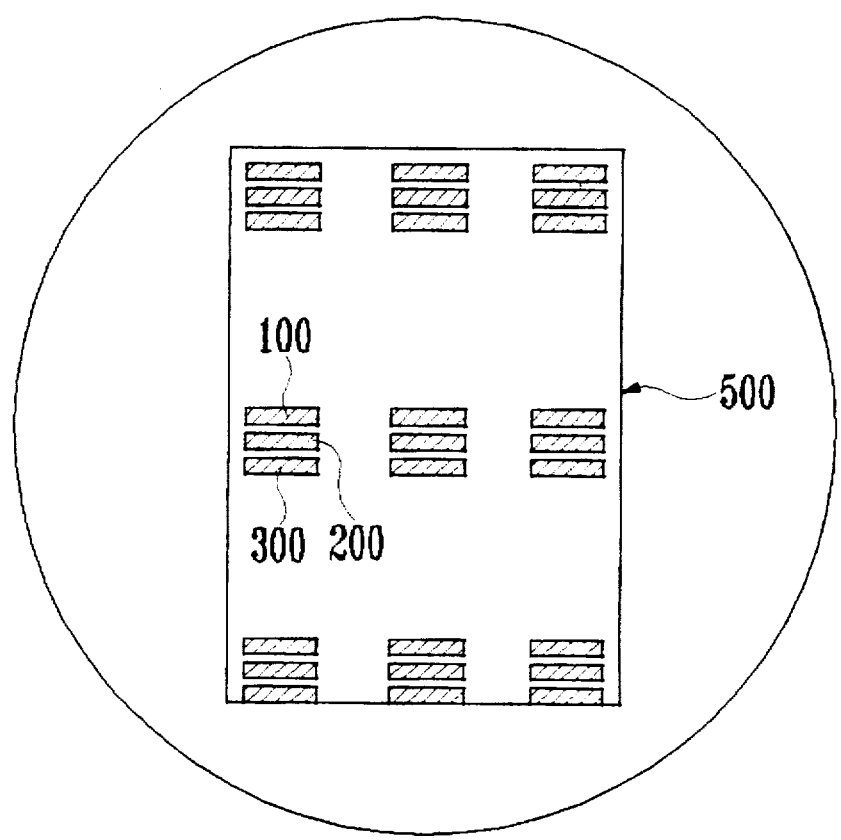
FIG. 4 is a plan view illustrating a photo mask for a process margin test including a plurality of unit patterns consisting of three different process margin test patterns, each unit pattern being arranged on each portion of a chip which is divided into 9 portions.

FIG. 4 illustrates a photo mask provided with the above-mentioned process margin test patterns 100, 200 and 300 respectively shown in FIGS. 1 to 3 in accordance with the present invention. The photo mask, which is denoted by the reference numeral 500, is vertically divided into three portions, namely, an upper portion, a central portion and a lower portion. Each portion of the photo mask 500 is also horizontally divided into three portions, namely, a left portion, a central portion and a right portion. That is, the photo mask is divided into 9 portions each having the first, second and third process margin test patterns 100, 200 and 300.

In each portion of the photo mask 500, the first, second and third process margin test patterns 100, 200 and 300 are spaced apart from one another by a distance of about 100 μm.

At the first process margin test pattern 100, the photo mask 500 includes a line/space pattern portion having a plurality of spaced lines and a contact hole portion having contact holes. The lines and contact holes are repeatedly arranged laterally in such a manner that the first process margin test pattern 100 has four lines and eight contact holes in every pitch.

In every pitch, the first process margin test pattern 100 has a pair of first line patterns having different lengths and a pair of second line patterns having different lengths. The second line patterns have a linewidth different from that of the first line patterns.

In every pitch, the first process margin test pattern 100 also has two pairs of first contact holes longitudinally spaced from each other by a distance d1 and two pairs of second contact holes longitudinally spaced from each other by the distance d1. The second contact holes are larger than the first contact holes.

At the second process margin test pattern 200, the photo mask 500 includes two sets of line/space patterns formed on the upper and lower portions of the second process margin test pattern 200, respectively. In this pattern 200, there is no gap between the line/space pattern sets. Each line/space pattern set includes a plurality of spaced lines repeatedly laterally arranged in such a manner that the second process margin test pattern 200 has four lines in every pitch.

In every pitch, the second process margin test pattern 200 has a pair of first line patterns having different lengths and a pair of second line patterns having different lengths. The second line patterns have a linewidth different from that of the first line patterns. The longer the first and second line patterns in the upper line/space pattern set are in contact with the corresponding longer lower line/space pattern set at their facing ends, respectively. Thus, the second process margin test pattern 200 has a pattern structure having vertical symmetry.

At the third process margin test pattern 300, the photo mask 500 includes two sets of line/space patterns formed on the upper and lower portions of the third process margin test pattern 200, respectively. In this pattern 300, there is a gap d2 between the line/space pattern sets. Thus, the third process margin test pattern 300 has a pattern structure having vertical symmetry. Each line/space pattern set includes a plurality of spaced lines repeatedly laterally arranged in such a manner that the third process margin test pattern 300 has four lines in every pitch.

In every pitch, the third process margin test pattern 300 has a pair of first line patterns having different lengths and a pair of second line patterns having different lengths. The second line patterns have a linewidth different from that of the first line patterns.

Thus, the first, second and third process margin test patterns 100, 200 and 300 constitute a unit test pattern in which those patterns are arranged adjacent to one to another. Where a chip is longitudinally and laterally divided into 9 portions, such a unit test pattern is provided at each portion of the chip.

A procedure for performing a process margin test using the photo mask having the above-mentioned configuration will be described.

For the process margin test, data about line/space patterns and contact hole patterns formed on the photo mask are stored in a CAD. Also, the fabrication of the photo mask is carried out using the stored data so that the photo mask has a configuration shown in FIG. 4.

Although not shown, a photoresist film is then coated over a wafer. Using the photo mask, the photoresist film is then subjected to a light exposure and development process, thereby forming a photoresist film pattern.

Thereafter, the image of the photoresist film pattern is compared with the data stored in the CAD. As a result of the comparison, defect positions and defect sizes are outputted.

Based on the outputted data, the operator analyzes defects generated on the photoresist film pattern, thereby determining a desired process margin.

Where the chip is divided into 9 portions each having the first, second and third process margin test patterns, the difference of about 10 to 100 in the number of defects between different portions of the chip may be evaluated as an abnormality of the stepper lens.

As is apparent from the above description, the present invention provides the following effects.

That is, in accordance with the present invention, it is possible to simultaneously test a variety of process margins required in the fabrication of a semiconductor device at a single light exposure and development process, by use of a photo mask which is adapted to form line/space and contact holes having a variety of linewidths and lengths over a chip in a repeated manner. Accordingly, it is possible to reduce the time taken to achieve the process margin test, as compared to the conventional cases.

The photo mask of the present invention can be also applied to required patterning processes using data about associated process margins, respectively. Accordingly, the productivity is improved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A photo mask comprising:
   a first process margin test pattern including a plurality of line/space patterns consisting of a first pair of line/space patterns having different lengths and a second pair of line/space patterns having different lengths while having a linewidth different from that of the first line/space pattern pair, the first and second line/space patterns being laterally arranged in a repeated manner, and a plurality of contact holes consisting of a first pair of contact holes and a second pair of contact holes, the first and second contact hole pairs being laterally and longitudinally arranged in a repeated manner while being longitudinally spaced from the line/space patterns by a desired distance;
   a second process margin test pattern including two sets of line/space patterns formed in a symmetrical manner on upper and lower portions of the second process margin test pattern, respectively, each of the line/space pattern sets including a plurality of line/space patterns consisting of a first pair of line/space patterns having different lengths and a second pair of line/space patterns having different lengths while having a linewidth different from that of the first line/space pattern pair, the first and second line/space patterns being laterally arranged in a repeated manner, the longer of the first and second line patterns in the upper line/space pattern set being in contact with the correspondingly longer of the lower line/space pattern set at their facing ends, respectively, whereby the second process margin test pattern has a symmetrical pattern structure; and a third process margin test pattern including two sets of line/space patterns formed in a symmetrical manner on upper and lower portions of the second process margin test pattern, respectively, each of the line/space pattern sets including a plurality of line/space patterns consisting of a first pair of line/space patterns having different lengths and a second pair of line/space patterns having different lengths while having a linewidth different from that of the first line/space pattern pair, the first and second line/space patterns being laterally arranged in a repeated manner, the longer ones of the first and second line patterns in the upper line/space pattern set being spaced from the corresponding longer ones in the lower line/space pattern set by a desired distance at their facing ends, respectively, whereby the second process margin test pattern has a symmetrical pattern structure.

2. The photo mask in accordance with claim 1, wherein the line/space patterns of the first line/space pattern pairs in all the test patterns have a linewidth of about 0.3 to 1 µm when i-line is used as a light exposure source.

3. The photo mask in accordance with claim 1, wherein the line/space patterns of the second line/space pattern pairs in all the test patterns have a linewidth of about 0.3 to 1 µm when i-line is used as a light exposure source.

4. The photo mask in accordance with claim 1, wherein the line/space patterns of the first line/space pattern pairs in all the test patterns have a linewidth of about 0.2 to 0.7 µm when KrF is used as a light exposure source.

5. The photo mask in accordance with claim 1, wherein the line/space patterns of the second line/space pattern pairs in all the test patterns have a linewidth of about 0.2 to 0.7 µm when KrF is used as a light exposure source.

6. The photo mask in accordance with claim 1, wherein the line/space patterns of the first line/space pattern pairs in all the test patterns have a linewidth of about 0.15 to 0.5 µm when ArF is used as a light exposure source.

7. The photo mask in accordance with claim 1, wherein the line/space patterns of the second line/space pattern pairs in all the test patterns have a linewidth of about 0.15 to 0.5 µm when ArF is used as a light exposure source.

8. The photo mask in accordance with claim 1, wherein the contact holes of the first and second contact hole pairs have the same linewidths as those of the first and second line/space pairs, respectively.

9. The photo mask in accordance with claim 1, wherein the contact holes of the first and second contact hole pairs have linewidths longer than those of the first and second line/space pairs by a length of about 0.05 to 0.1 µm, respectively.

10. The photo mask in accordance with claim 1, wherein the first, second and third process margin test patterns constitute a unit test pattern, and the unit test pattern is provided at each portion of a chip which is longitudinally and laterally divided into 9 portions.

11. The photo mask in accordance with claim 1, wherein the first, second and third process margin test patterns have a lateral size of 2,000 to 4,000 µm.

12. A method for performing a process margin test, comprising the steps of:

preparing a wafer;

coating a photoresist film over the wafer;

performing a light exposure and development process for the photoresist film using a photo mask over which a plurality of unit patterns each consisting of three different process margin patterns are arranged, thereby forming a photoresist film pattern; and comparing an image of the photoresist film pattern with data about the process margin patterns of the photo mask stored in a CAD, thereby performing a process margin test.

13. The method in accordance with claim 12, wherein the photoresist film pattern is checked using a defect checking device to output data about pattern positions and pattern sizes, so that the process margin test is performed using the outputted data.

* * * * *